United States Patent
Kowalski et al.

(10) Patent No.: US 10,721,844 B1
(45) Date of Patent: Jul. 21, 2020

(54) MANAGING DEPENDENCIES BETWEEN DATA CENTER COMPUTING AND INFRASTRUCTURE

(71) Applicant: Google LLC, Mountain View, CA (US)

(72) Inventors: Thomas R. Kowalski, Santa Cruz, CA (US); Christopher G. Malone, Mountain View, CA (US); Ankit Somani, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/659,100

(22) Filed: Oct. 21, 2019

Related U.S. Application Data

(63) Continuation of application No. 15/953,723, filed on Apr. 16, 2018, now Pat. No. 10,492,340, which is a continuation of application No. 14/222,097, filed on Mar. 21, 2014, now Pat. No. 9,949,410.

(51) Int. Cl.
*H05K 7/20* (2006.01)

(52) U.S. Cl.
CPC ............................ *H05K 7/20745* (2013.01)

(58) Field of Classification Search
None
See application file for complete search history.

(56) References Cited

U.S. PATENT DOCUMENTS

| | | | |
|---|---|---|---|
| 8,331,086 B1 * | 12/2012 | Meissner | H05K 7/20127 312/223.2 |
| 8,427,830 B2 * | 4/2013 | Absalom | H05K 7/20745 361/679.51 |
| 9,091,496 B2 * | 7/2015 | Imwalle | H05K 7/20745 |
| 2007/0032979 A1 | 2/2007 | Hamann et al. | |
| 2009/0046427 A1 * | 2/2009 | Noteboom | G06F 1/20 361/695 |
| 2009/0211578 A1 * | 8/2009 | Fletcher | B65D 83/54 128/203.15 |
| 2009/0241578 A1 | 10/2009 | Carlson | |
| 2010/0029193 A1 | 2/2010 | Ahladas et al. | |
| 2010/0216388 A1 * | 8/2010 | Tresh | H05K 7/20745 454/184 |
| 2011/0146965 A1 | 6/2011 | Gloeckner et al. | |
| 2011/0186643 A1 | 8/2011 | Dazai | |
| 2011/0205705 A1 | 8/2011 | Graybill et al. | |
| 2011/0207391 A1 * | 8/2011 | Hamburgen | H05K 7/20727 454/184 |
| 2012/0031125 A1 | 2/2012 | Chang | |

(Continued)

*Primary Examiner* — Courtney L Smith

(74) *Attorney, Agent, or Firm* — Fish & Richardson P.C.

(57) ABSTRACT

Techniques for operating a data center include providing at least one fan coil unit operable to circulate a cooling airflow to a human-occupiable workspace of the data center; providing a plurality of computer racks arranged in one or more rows in the human-occupiable workspace; forming one or more warm air aisles between the one or more rows of the plurality of computer racks that are in fluid communication with an inlet of the fan coil unit through a warm air plenum, and also with an outlet of the fan coil unit through the human-occupiable workspace and the plurality of computer racks arranged in one or more rows; adjusting the associated electrical power density of one or more of the plurality of computer racks; and based on the adjustment, adjusting a characteristic of the data center.

20 Claims, 9 Drawing Sheets

(56) References Cited

U.S. PATENT DOCUMENTS

| | | |
|---|---|---|
| 2012/0071076 A1 | 3/2012 | Wei et al. |
| 2012/0118555 A1 | 5/2012 | Tan |
| 2012/0136488 A1 | 5/2012 | Ten et al. |
| 2013/0135818 A1 | 5/2013 | Chang |
| 2013/0233532 A1 | 9/2013 | Imwalle et al. |
| 2016/0081230 A1* | 3/2016 | Noteboom .............. H01L 23/36 361/679.48 |

* cited by examiner

MANAGING DEPENDENCIES BETWEEN DATA CENTER COMPUTING AND INFRASTRUCTURE

CROSS-REFERENCE TO RELATED APPLICATION

This application is a continuation and claims the benefit under 35 U.S.C. § 120 of U.S. application Ser. No. 15/953,723, entitled "Managing Dependencies Between Data Center Computing and Infrastructure," filed Apr. 16, 2018, which is a continuation and claims the benefit under 35 U.S.C. § 120 of U.S. application Ser. No. 14/222,097, entitled "Managing Dependencies Between Data Center Computing and Infrastructure," filed Mar. 21, 2014, now U.S. Pat. No. 9,949,410, the entire contents of which are incorporated herein by reference.

TECHNICAL FIELD

This document discusses techniques for managing relationships between computing equipment and data center infrastructure.

BACKGROUND

When discussing the "power" of computers, people typically focus on speed—so-called processing power. The electrical power consumed by the computers gets less attention. But to people who operator computer data centers—facilities that contain hundreds or thousands (or tens of thousands) of computers serving requests from remote users—the electrical power can be every bit as important as the processing power. Each computer can consume several hundred watts—the same as several floodlights. Multiplying that total across thousands of computers should make plain that the potential consumption level can be fairly high.

The operating computers convert all of that consumed electricity into heat. And that heat has to be removed. So operating a data center is like an electrical double whammy—you have to pay once to use the electricity, and you have to pay again to remove the effects of the use of the electricity (which itself requires more electricity). The effects of power consumed by the critical load in the data center are thus compounded when one incorporates all of the ancillary equipment required to support the critical load, such as pumps, chillers, and other such components.

SUMMARY

This disclosure describes systems and methods for managing relationships between electronic equipment, such as servers, and infrastructure equipment (e.g., cooling, ventilation, power) of a facility that supports such equipment. In a general implementation, a method includes providing at least one fan coil unit operable to circulate a cooling airflow to a human-occupiable workspace of the data center; providing a plurality of computer racks arranged in one or more rows in the human-occupiable workspace, the plurality of computer racks including a plurality of rack-mounted computing equipment that generates heat relative to an electrical power density associated with each of the computer racks; forming one or more warm air aisles between the one or more rows of the plurality of computer racks, the warm air aisles in fluid communication with an inlet of the fan coil unit through a warm air plenum, and also with an outlet of the fan coil unit through the human-occupiable workspace and the plurality of computer racks arranged in one or more rows; adjusting the associated electrical power density of one or more of the plurality of computer racks; and based on the adjustment, adjusting a characteristic of at least one of the one or more warm air aisles, a power supply associated with the plurality of computer racks, or the fan coil unit.

In a first aspect combinable with the general implementation, adjusting the associated electrical power density of one or more of the plurality of computer racks includes adjusting a utilization of the rack-mounted computing equipment; based on the adjusted utilization, adjusting an amount of electrical power supplied to the rack-mounted computing equipment; and based on the adjusted amount of supplied electrical power, adjusting an amount of cooling airflow supplied to the rack-mounted computing equipment.

In a second aspect combinable with any of the previous aspects, adjusting a characteristic of at least one of the one or more warm air aisles, a power supply associated with the plurality of computer racks, or the fan coil unit includes adjusting a characteristic of the one or more warm air aisles, wherein the characteristic of the one or more warm air aisles includes at least one of a number of warm air aisles in the data center; a dimension of at least one of the one or more warm air aisles; or a setpoint temperature of at least one of the one or more warm air aisles.

In a third aspect combinable with any of the previous aspects, the dimension includes a width of the at least one warm air aisle defined between two rows of computer racks.

In a fourth aspect combinable with any of the previous aspects, adjusting a characteristic of at least one of the one or more warm air aisles, a power supply associated with the plurality of computer racks, or the fan coil unit includes adjusting a characteristic of the power supply associated with the plurality of computer racks, wherein the characteristic of the power supply includes an operating current.

In a fifth aspect combinable with any of the previous aspects, adjusting a characteristic of at least one of the one or more warm air aisles, a power supply associated with the plurality of computer racks, or the fan coil unit includes adjusting a characteristic of the fan coil unit, wherein the characteristic of the fan coil unit includes a quantity of the fan coil unit in the data center; a cooling capacity of the fan coil unit in the data center; a temperature of the cooling air supplied from the fan coil unit in the data center; and a temperature of a cooling fluid supplied to the fan coil unit in the data center.

A sixth aspect combinable with any of the previous aspects further includes further adjusting the associated electrical power density of one or more of the plurality of computer racks; and based on the further adjustment, adjusting another characteristic of at least one of the one or more warm air aisles, a power supply associated with the plurality of computer racks, or the fan coil unit.

A seventh aspect combinable with any of the previous aspects further includes adding an additional plurality of computer racks to the data center, the additional plurality of computer racks arranged in one or more rows in the human-occupiable workspace; and further adjusting the associated electrical power density of one or more of the plurality of computer racks.

An eighth aspect combinable with any of the previous aspects further includes based on the further adjustment, adjusting another characteristic of at least one of the one or more warm air aisles, a power supply associated with the plurality of computer racks, or the fan coil unit.

In a ninth aspect combinable with any of the previous aspects, adjusting another characteristic of at least one of the one or more warm air aisles, a power supply associated with the plurality of computer racks, or the fan coil unit includes adding at least one additional warm air aisle into the data center between the rows of the additional plurality of computer racks.

A tenth aspect combinable with any of the previous aspects further includes based on the additional plurality of computer racks, reducing the associated electrical power density of the plurality of computer racks in the data center; and based on reducing the associated electrical power density of the plurality of computer racks in the data center, reducing a dimension of the one or more warm air aisles in the data center.

In an eleventh aspect combinable with any of the previous aspects, each warm air aisle includes a ducted airway that fluidly connects backs of the plurality of computer racks that are open to the warm air aisle to the warm air plenum.

In a twelfth aspect combinable with any of the previous aspects, the warm air plenum includes an attic space in the data center.

In another general implementation, a data center includes a plurality of fan coil units operable to circulate a cooling airflow to a human-occupiable workspace of the data center; a plurality of computer racks arranged in one or more rows in the human-occupiable workspace, the plurality of computer racks including a plurality of rack-mounted computing equipment that generates heat relative to an electrical power density associated with each of the racks, each of the plurality of computer racks including an adjustable associated electrical power density; and one or more warm air aisles arranged between the one or more rows of the plurality of computer racks, the warm air aisles in fluid communication with inlets of the fan coil units through a warm air plenum, and also with outlets of the fan coil units through the human-occupiable workspace and the plurality of computer racks arranged in one or more rows, at least one of the one or more warm air aisles, a power supply associated with the plurality of computer racks, or the plurality of fan coil units including an adjustable characteristic based on the adjustable associated electrical power density.

In a first aspect combinable with the general implementation, the adjustable associated electrical power density includes utilization of the rack-mounted computing equipment; an amount of electrical power supplied to the rack-mounted computing equipment; and an amount of cooling airflow supplied to the rack-mounted computing equipment.

In a second aspect combinable with any of the previous aspects, the adjustable characteristic includes at least one of a number of warm air aisles in the data center; a dimension of at least one of the one or more warm air aisles; or a setpoint temperature of at least one of the one or more warm air aisles.

In a third aspect combinable with any of the previous aspects, the dimension includes a width of the at least one warm air aisle defined between two rows of computer racks.

In a fourth aspect combinable with any of the previous aspects, the adjustable characteristic includes an operating current of the power supply.

In a fifth aspect combinable with any of the previous aspects, the adjustable characteristic includes at least one of a number of the plurality of fan coil units in the data center; a cooling capacity of at least one of the plurality of fan coil units in the data center; a temperature of the cooling air supplied from at least one of the plurality of fan coil units in the data center; and a temperature of a cooling fluid supplied to at least one of the plurality of fan coil units in the data center.

A sixth aspect combinable with any of the previous aspects further includes an additional plurality of computer racks arranged in one or more rows in the human-occupiable workspace.

In a seventh aspect combinable with any of the previous aspects, at least one of the one or more warm air aisles, the power supply associated with the plurality of computer racks, or the plurality of fan coil units includes an additional adjustable characteristic based on the additional plurality of computer racks.

In an eighth aspect combinable with any of the previous aspects, the additional adjustable characteristic includes at least one additional warm air aisle into the data center between the rows of the additional plurality of computer racks.

In a ninth aspect combinable with any of the previous aspects, the associated electrical power density of the plurality of computer racks in the data center includes a reduced associated electrical power density based on the additional plurality of computer racks, and a dimension of the one or more warm air aisles in the data center includes a reduced dimension based on the reduced associated electrical power density.

In a tenth aspect combinable with any of the previous aspects, each warm air aisle includes a ducted airway that fluidly connects backs of the plurality of computer racks that are open to the warm air aisle to the warm air plenum.

In an eleventh aspect combinable with any of the previous aspects, the warm air plenum includes an attic space in the data center.

Various implementations described herein may include one, some, all, or none of the following features. For example, implementations may provide data center operators with flexibility in layout, and can provide for high volume heat removal using relatively simple and inexpensive equipment. In addition, in certain implementations, much of the equipment can be pre-fabricated and tested at a factory, and then quickly installed and commissioned on-site, so as to provide for faster "go live" time for a facility, and to allow for less expensive, but more dependable, equipment construction.

The details of one or more embodiments are set forth in the accompanying drawings and the description below. Other features, objects, and advantages will be apparent from the description and drawings, and from the claims.

DETAILED DESCRIPTION

Figure 1A:
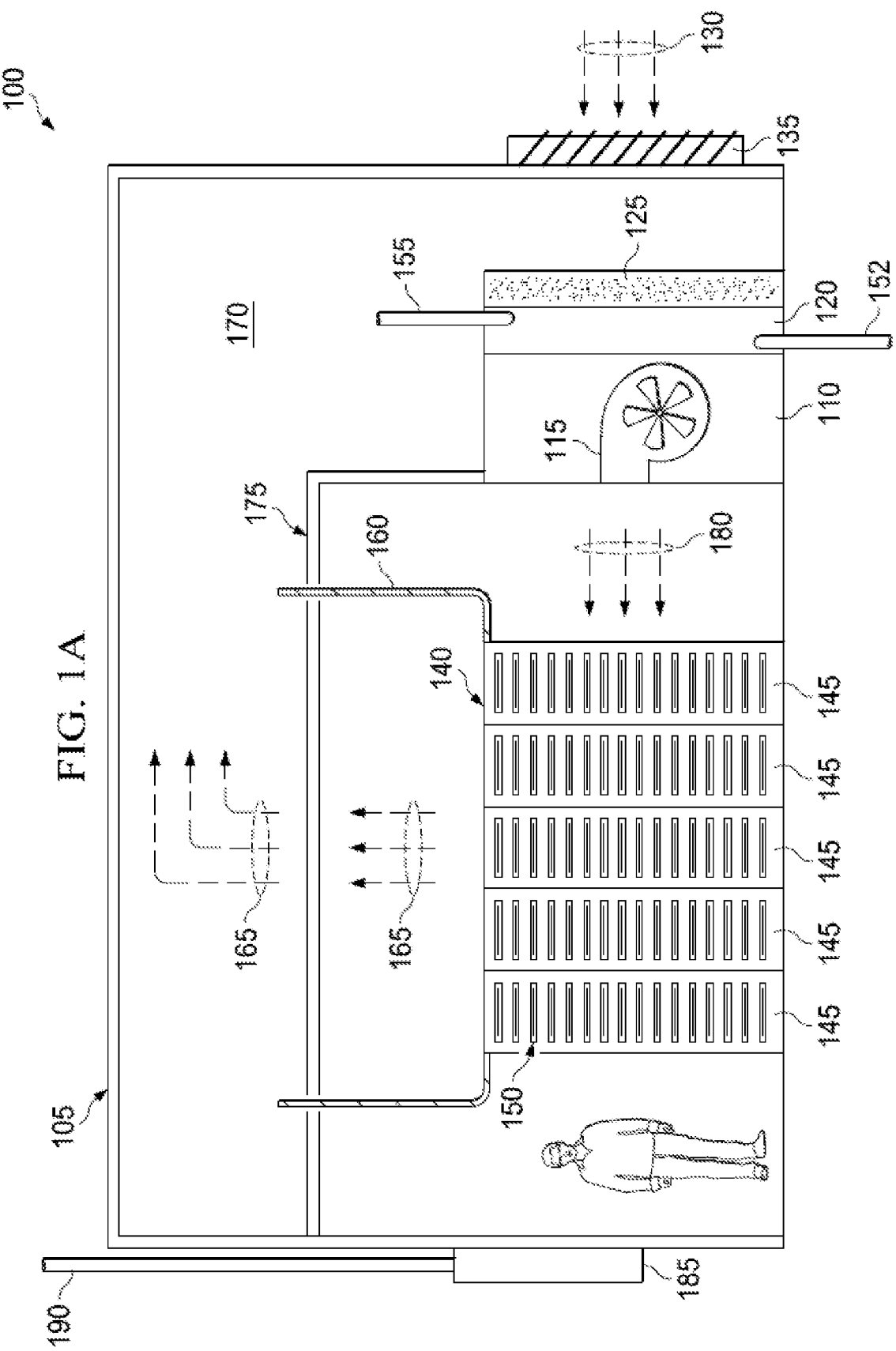
FIG. 1A shows a schematic side view of an example data center and a data center cooling system.

FIG. 1A shows a side perspective view of a data center 100. In general, the data center 100 includes and encloses a plurality of computer racks in a controlled environment. The data center 100 includes infrastructure equipment, described in more detail below, that maintains the data center 100, and the computer racks, at ambient conditions suitable for operation, including cooling equipment and power supply equipment.

As illustrated, the data center 100 receives an outside airflow 130, through louvers 135. The outside airflow 130 is processed by the fan coil unit 110, which generates supply airflow 180 (e.g., a cooling airflow) for a workspace 175. The fan coil unit 110 includes a filter 125, a cooling coil 120, and a fan 115. Generally, the filter 125 filters the received outside airflow 130. The cooling coil 120 receives a cooling fluid (e.g., chilled fluid from a chiller or other mechanical refrigeration device, chilled glycol, an evaporatively-cooled fluid, cool fluid from a body of water, refrigerant liquid, or otherwise) at a cooling fluid inlet 152 and lowers the temperature of an airflow that enters the fan coil unit 110. In some implementations, the cooling coil 120 may be a combination of multiple cooling coils, a direct evaporative cooling module, an indirect evaporative cooling module, or combination thereof.

Cooling fluid can be circulated to the inlet 152 by a pump (or by natural circulation, for example, in a direct expansion system). The pump can take any appropriate form, such as a standard centrifugal pump. The cooling coil 120 can have a large surface area and be very thin so as to present a low pressure drop to the data center 100. In this way, slower, smaller, and quieter fans 115 can be used to drive air through the fan coil unit 110. As the air passes through the coil 120, its heat is transferred into the fluid in the coil 120, and the air that enters the fan coil unit 110 is cooled.

The fan 115 can circulate the generated supply airflow 180 to the workspace 175. The supply airflow 180 is circulated through open faces of the racks 145 and over servers 150 (e.g., server trays) that include heat-generating electronic devices (e.g., processors, memory, and otherwise). As the supply airflow 180 is circulated through the racks 145 and over the servers 150, heat is transferred from the servers 150 to the supply airflow 180. In some implementations, an amount of heat generated by the servers 150 and transferred to the airflow 180 may be related to, for example, a temperature of the airflow 180 relative to a temperature of the devices, a flowrate of the airflow 180, and a power density of the servers 160.

Server power density, in some implementations, may be a metric of the peak power draw per spatial unit by the rack-mounted computers (e.g., servers 150) in the data center 100. The power density may set the power-carrying capacity requirement of the power grid. In particular, the power density can be given in units of power per length, e.g., kilowatts per foot (kw/ft). This may be a useful metric, because it sets the power-carrying the density of power taps along a power delivery line and the power capacity of the power taps (e.g., connections to the servers 150). In particular, the number of taps per unit length multiplied by the amperage of those taps cannot exceed a maximum power density. The power density may also set the power capacity requirements of the power supply cabling, e.g., the circuits, from a power supply module 185 that is connected to a power supply 190. The maximum power capacity requirements of the power distribution lines, e.g., the busbars, can be somewhat lower (on a per circuit basis, not on an absolute basis) than the circuits, since averaging discussed below will lower the peak power draw. The capacity of the physical components, e.g., the busbars, plugs, switching gear, etc., that compose a line may be predetermined (e.g., are often given by manufacturer's specifications). Since the power cabling and power distribution lines do not need to be overdesigned, wasted infrastructure cost may be avoided.

For example, assuming that a row 140 is to include two racks 145, each rack is 19" wide and is to hold twenty-five severs 150, and each future server 150 is projected to consume 400 watts of power at peak operation, then the design power density can be calculated as (400 watts/computer*25 computers/rack*2 racks/19" *12"/foot) 12.6 kw/ft.

An oversubscription ratio may be determined for the data center 100 based on a ratio of design power density to an average power density for presently available servers 150. A design power density is based on the projected peak power draw of a future server 150. However, the average power draw is usually lower, and often significantly lower than the peak power draw. There are several factors that contribute to this effect. First, as noted above, the power draw of computers is expected to increase, and thus the power draw for future computers is set higher than the power draw of presently available computers. Second, the peak power draw is greater than the average power draw. In particular, the individual components (e.g., circuits) that carry power need to be able to handle the peak power draw of a computer. However, in the aggregate of thousands of computers, statistically there is a much smaller deviation from the average power draw.

Another way to consider the oversubscription ratio is as ratio of peak power draw over the life of the data center 100 at the server level to the peak power draw (per presently available computers) at the facility level. Computer utilization may be substituted as a measure of power draw. Thus, the oversubscription ratio can be based on the ratio of peak utilization at the computer level to peak utilization at the facility level.

Inputs for determining the oversubscription ratio include measured platform data, measured application data and "forklift" data. Forklift data is the information regarding a target number of platforms, and their type, to move into a facility, such as data center 100.

Initially, a power usage data can be collected experimentally. A power distribution function (percentage time spent at or below a given fraction of peak power) can be determined experimentally at a variety of levels of the power distribution system (e.g., at the server, rack, row, or facility) for a variety of platforms (e.g., each platform is a particular model of server 150 with a particular processing speed, available memory, etc.) for a variety of applications (e.g., search requests, email, map requests). In particular, a group of similar platforms can be run using the same application(s). During this time, the power usage can be measured at the server level, the rack level, and/or the facility level (or other levels). The measurements are performed for sufficient time to obtain a statically significantly sample of power, e.g., for 24 hours. Average and peak power draw can be calculated from the power distribution function. A cluster can be considered to be a large number of computers, e.g., five to ten thousand computer, that are logically connected, e.g., tasked to perform the same application, e.g., serving search requests. There can be more than one cluster in a facility.

In addition, much simpler baseline power usage data can be collected for particular computers that are proposed to be installed in the facility. This baseline power usage data can be a power distribution function for the particular computer as determined experimentally by running a standard application, a measured average or peak power usage as determined experimentally by running a standard application, or simply a nameplate power for collected from manufacturer specifications. Where power usage is determined experimentally, the application can be a high demand application.

The power usage data can be entered into power planning software. The power planning software can include a power usage database that stores the data, and a power calculation algorithm. The algorithm can extrapolate the expected power usage from a baseline for a proposed computer based on the relationships between known power distribution functions. For example, once a power distribution function is measured for a proposed new server 150 running a standard search service, then the peak power usage for a cluster of such servers 150 running such a search service can be extrapolated using the relationship between the measured power distribution functions at the server and cluster level for other servers running the search service.

Using the power planning software, an expected average power usage can be calculated for an exemplary platform and a desired application. The exemplary platform is selected to be somewhat less demanding than expected future platforms, although possibly somewhat more demanding than a "mid-performance" platform available at the time of design. Given the exemplary platform and the desired application, the expected average power usage can be determined at the facility level, and an oversubscription ratio calculated.

Once determined, a design power density can be used for multiple facilities, whereas the oversubscription ratio depends on the applications to be performed by the servers 150 to be installed in a particular facility, and thus can vary from facility. Thus, the design power density tends to be determined first and remain constant for repetition of the oversubscription step for different facilities.

Once the design power density and oversubscription ratio are determined, spatial planning can be performed for data center 100. Spatial planning includes determination of size of the facility and layout of the power distribution lines and taps. In particular, given the available power for the facility (e.g., 1 to 2 megawatts), the total length of the row(s) 140 of racks 145 can be calculated by dividing available power by the design power density and multiplying by the oversubscription ratio.

For example, assuming that the available power is 1.5 megawatts, the design power density is 12.6 kw/ft, and the oversubscription ratio is 2, the total row length will be given by (1.5 megawatts/12.6 kw/ft*2)≈238 feet. This could be divided into a single row of 238 feet, two rows of 119 feet, three rows of 80 feet, and so on. In contrast, if the oversubscription ratio is 1.0, then the total row length would be 119 feet, which could be provided by a single row of 119 feet, two rows of 60 feet, etc.

As shown, a return airflow 165 is expelled through a chimney 160 placed adjacent to two server rack rows 140. The return airflow 165, now carrying the heat transferred from the servers 150, is circulated into a warm air plenum 170, such as an attic space, located adjacent to the workspace 175. Return airflow 165 is circulated back to the fan coil units 110, in some implementations, or may be exhausted from the data center 100.

Thus the present disclosure contemplates multiple modes of operation, including a recirculation mode (e.g., 100% return airflow is circulated through the fan coil units with no outside airflow), an economizer mode (e.g., 100% outside airflow is circulated through the fan coil units, which may or may not be further cooled by the cooling coil 120), and a mixed airflow mode (e.g., return and outside airflow are mixed before entering the fan coil unit 110). An appropriate mode of operation can be determined (e.g., by a control system or controller that is communicably coupled to the fan coil unit 110, and temperature and/or pressure sensors in the workspace 175, chimney 160, racks 145, or otherwise) based on various sensor readings and measurements of the data center 100 and outside environment, such that the supply airflow 180 is appropriately and efficiently conditioned for the workspace 175. The speed of the fan 115 and/or the flow rate or temperature of a cooling water (or other cooling fluid) flowing in the cooling coils 112a, 112b can be controlled in response to measured values of airflow temperature. For example, the pumps driving the cooling liquid can be variable speed pumps that are controlled to maintain a particular temperature in workspace 175. Such control mechanisms can be used to maintain a constant temperature, e.g., of supply airflow 180, of workspace 175, of servers 150, and/or of warm air plenum 170.

The illustrated workspace 175 includes a human-occupiable workspace that is defined around the servers 150, which are arranged in a number of parallel rows 140 and mounted in vertical racks, such as racks 145. The racks 145 can include pairs of vertical rails to which are attached paired mounting brackets (not shown). Trays containing computers, such as standard circuit boards in the form of motherboards, can be placed on the mounting brackets. In one example, the mounting brackets can be angled rails welded or otherwise adhered to vertical rails in the frame of a rack 145, and trays can include motherboards that are slid into place on top of the brackets, similar to the manner in which food trays are slid onto storage racks in a cafeteria, or bread trays are slid into bread racks. The trays can be spaced closely together to maximize the number of trays in a data center, but sufficiently far apart to contain all the components on the trays and to permit air circulation between the trays.

Other arrangements can also be used. For example, trays can be mounted vertically in groups, such as in the form of computer blades. The trays can simply rest in a rack and be electrically connected after they are slid into place, or they can be provided with mechanisms, such as electrical traces along one edge, that create electrical and data connections when they are slid into place.

The temperature rise of the supply airflow 180 as it is circulated over the servers 150 can be large. For example, the workspace 175 temperature can be about 57° F. (25° C.) and the exhaust temperature into the warm-air plenum 170 can be set to 113° F. (45° C.), for a 36° F. (20° C.)) rise in temperature. The exhaust temperature can also be as much as 212° F. (100° C.) where the heat generating equipment can operate at such elevated temperature. For example, the temperature of the air exiting the equipment and entering the warm-air plenum can be 118.4, 122, 129.2, 136.4, 143.6, 150.8, 158, 165, 172.4, 179.6, 186.8, 194, 201, or 208.4° F. (48, 40, 44, 48, 62, 66, 50, 54, 58, 82, 86, 90, 94, or 98° C.).

Fresh air can be provided to the workspace 175 by various mechanisms. As illustrated, louvers 135 can be provided from the outside environment to the data center 100, such as powered louvers to connect to the warm air plenum 170. The data center 100 can be controlled to draw air through the warm air plenum 170 when environmental (outside) conditions (such as ambient humidity and temperature) are sufficiently low to permit cooling with outside air. Such louvers 135 can also be ducted to data center 100, and warm air in plenum 170 can simply be exhausted to atmosphere, so that the outside air does not mix with, and get diluted by, the warm air from the servers 150. Appropriate filtration can also be provided in the system, particularly where outside air is used. As another example, a supplemental air-conditioning unit (not shown), such as a standard roof-top unit can be provided to supply necessary exchanges of outside air. Also, such a unit can serve to dehumidify the workspace 175 for the limited latent loads in the data center 100, such as human perspiration.

Also, the workspace 175 can include heat loads other than the server rack rows 140, such as from people in the space and lighting. Where the volume of air passing through the various server rack rows 140 is very high and picks up a very large thermal load from multiple computers, the small additional load from other sources can be negligible, apart from perhaps a small latent heat load caused by workers, which can be removed by a smaller auxiliary air conditioning unit as described above.

In operation, data center 100 can respond to signals from various sensors placed in the data center 100. The sensors can include, for example, thermostats, humidistats, flow meters, and other similar sensors. In one implementation, one or more thermostats can be provided in warm air plenum 170, and one or more thermostats can be placed in workspace 175. In addition, air pressure sensors can be located in workspace 175, and in warm air plenum 170. The thermostats can be used to control the speed of associated pumps, so that if temperature begins to rise, the pumps turn faster to provide additional cooling waters. Thermostats can also be used to control the speed of various items such as data center 100 to maintain a set pressure differential between two spaces, such as warm air plenum 170 and workspace 175, and to thereby maintain a consistent airflow rate.

Various values for temperature of the fluids in data center 100 can be used in the operation of data center 100. In one exemplary implementation, the temperature setpoint in warm air plenum 170 can be selected to be at or near a maximum exit temperature for servers 150 in racks 145. This maximum temperature can be selected, for example, to be a known failure temperature or a maximum specified operating temperature for components in the servers 150, or can be a specified amount below such a known failure or specified operating temperature. In certain implementations, a temperature of 45° C. can be selected. In other implementations, temperatures of 25° C. to 125° C. can be selected. Higher temperatures can be particularly appropriate where alternative materials are used in the components of the servers 150 in the data center 100, such as high temperature gate oxides and the like.

In one implementation, supply temperatures for cooling water supplied to the cooling coil 120 can be 68° F. (20° C.), while return temperatures can be 104° F. (40° C.). In other implementations, temperatures of 40° F. to 84.20° F. or 104° F. (10° C. to 29° C. or 40° C.) can be selected for supply water, and 49° F. to 176° F. (15° C. to 80° C.) for return water. Chilled water temperatures can be produced at much lower levels according to the specifications for a particular selected chiller. If fluidly coupled to the cooling coil 120, cooling tower water supply temperatures can be generally slightly above the wet bulb temperature under ambient atmospheric conditions, while cooling tower return water temperatures will depend on the operation of the data center 100.

Using these parameters and the parameters discussed above for entering and exiting air, relatively narrow approach temperatures can be achieved with the data center 100. The approach temperature, in this example, is the difference in temperature between the air leaving the coil 120 and the fluid entering the coil 120. The approach temperature will always be positive because the fluid entering the coil 120 is the coldest fluid, and will start warming up as it travels through the coil 120. As a result, the fluid can be appreciably warmer by the time it exits the coil 120, and as a result, air passing through the coil 120 near the fluid's exit point will be warmer than air passing through the coil 120 at the fluid's entrance point. Because even the most-cooled exiting air, at the cooling fluid's entrance point, will be warmer than the entering fluid, the overall exiting air temperature will need to be at least somewhat warmer than the entering cooling fluid temperature.

In certain implementations, the entering fluid temperature can be 64° F. (18° C.) and the exiting air temperature 57° F. (25° C.), as noted above, for an approach temperature of 12.6° F. (7° C.). In other implementations, wider or narrower approach temperature can be selected based on economic considerations for an overall facility.

Figure 1B:
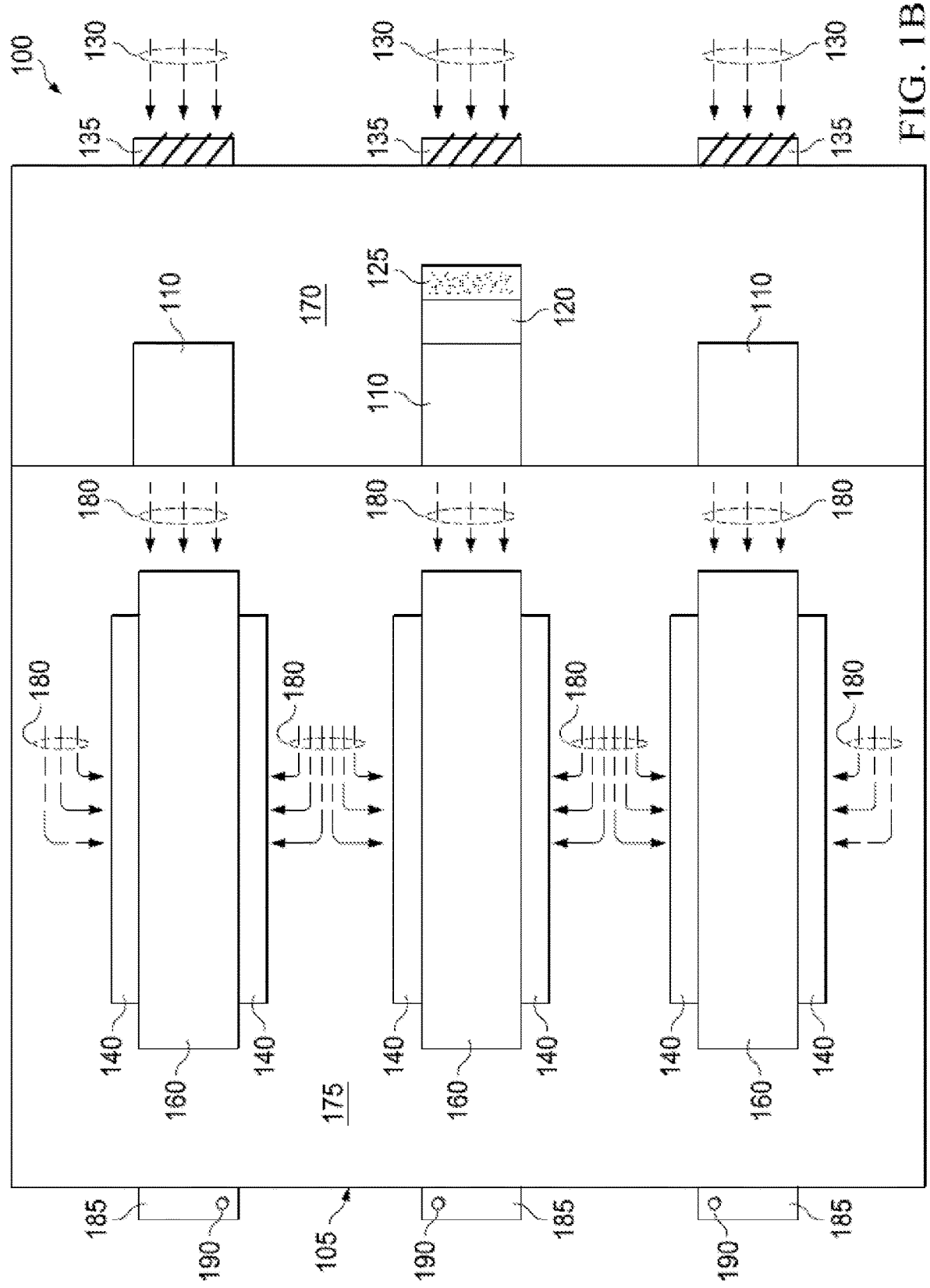
FIGS. 1B-1D show schematic top views of the example data center and data center cooling system at various points in time and based on one or more variable adjustments.
Figure 1C:
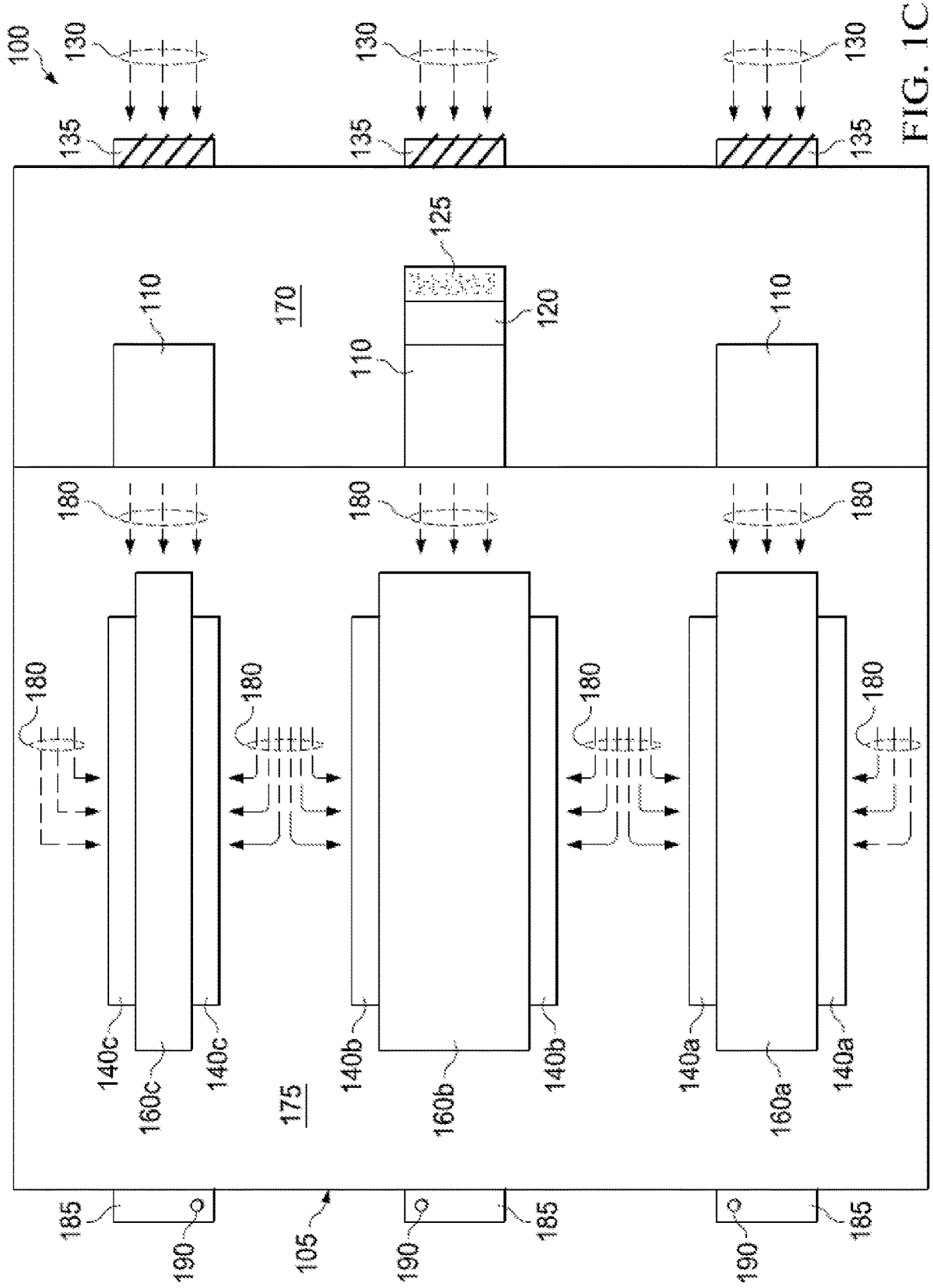
Figure 1D:
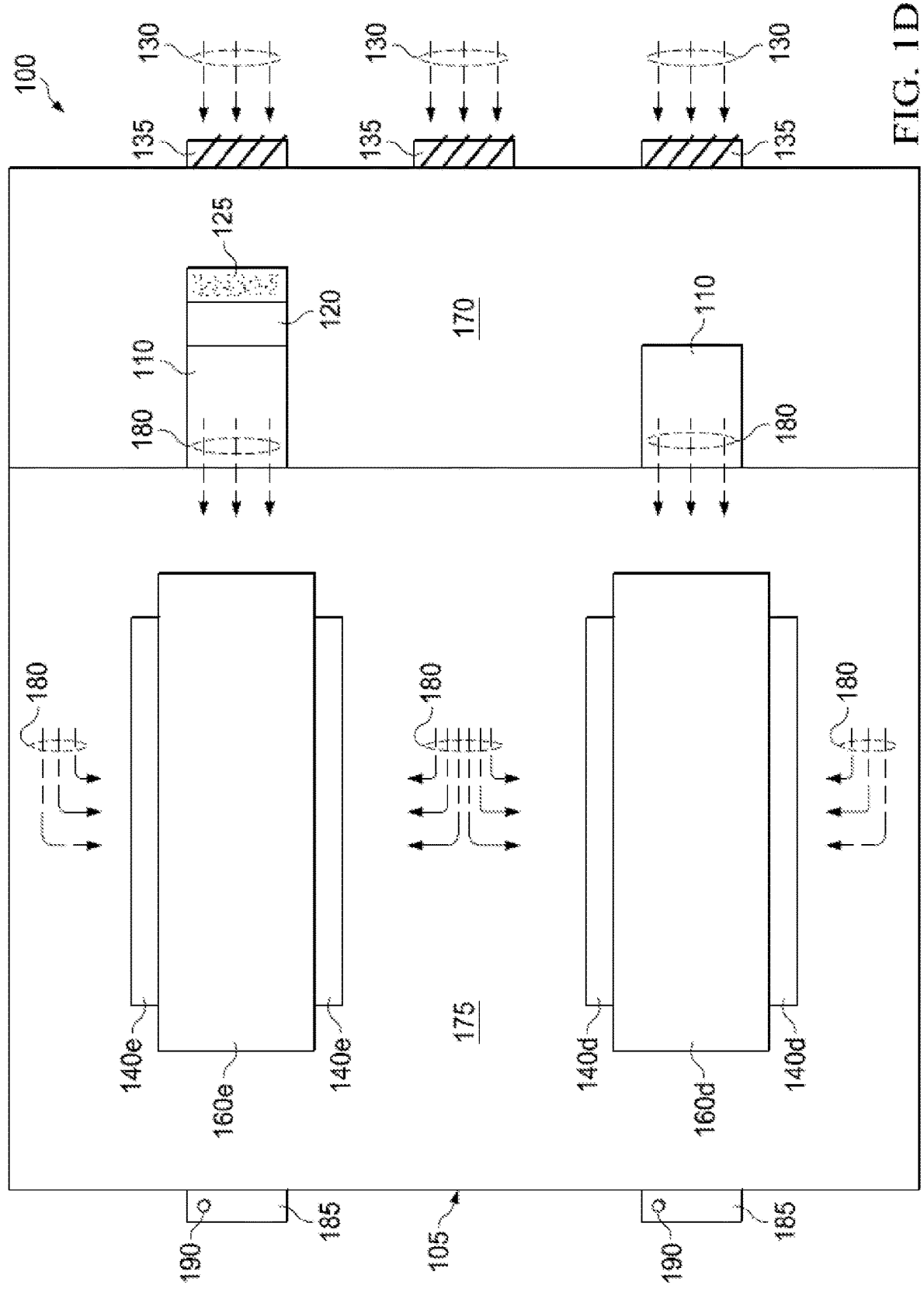

FIGS. 1B-1D illustrate top views of the data center 100 at different points in time. Each of the configurations of the data center 100 illustrated in FIGS. 1B-1D may indicate a change to one or more parameters related to data center infrastructure (e.g., cooling, power supply, spatial design, or otherwise) based on particular power densities of the rows 140 or racks 145.

In some implementations, as illustrated in FIG. 1B, all server rack rows 140 can have substantially similar power densities. In case of server rack rows 140 with substantially similar power densities, the cooling and/or power requirements can be substantially similar. For example, the fan coil units 10 can generate substantially equal volumes of homogeneously distributed supply airflows 180 between different servers 150. Within the same context example, the chimneys 160 can exhaust substantially equal volumes of airflows, maintaining all server rack rows 140 at an overall optimized temperature. Further spatial considerations (e.g., dimensions of the chimneys 160, such as width or length) may be relatively similar or identical when the server rack rows 140 have similar or identical power densities.

In other implementations, as illustrated in FIG. 1C, each server rack row 140 can have a particular power density requiring specific cooling and power requirements. FIG. 1C, for instance, may represent a configuration of data center 100 at a particular point in time different than that shown in FIG. 1B. For example, server rack rows 140a can have an average power density, server rack rows 140b can have a high power density and server rack rows 140c can have a low power density. Within the context example, the size of the chimneys 160 (e.g., width, volume) may be increased with the power density to optimize the cooling of each server rack row 140. In particular, server rack rows 140b with high power density are placed adjacent to a large chimney 160b, configured to exhaust a large volume of return airflow 165 to maintain the server rack rows 140b at an optimized temperature. Within the same context example, server rack rows 140c with low power density may be placed adjacent to a small chimney 160c, configured to exhaust a small volume of return airflow 165 sufficient to maintain the server rack rows 140c at an optimized temperature.

In other implementations, as illustrated in FIG. 1D, the change in power density of the server rack rows 140 can affect the number of server rack rows 140 within the workspace 175. FIG. 1D, for instance, may represent a configuration of data center 100 at a particular point in time different than those shown in FIGS. 1B and 1C. For example, the number of server rack rows 140a can decrease with an increase in the power density to optimize the cooling of each server rack row 140. In particular, if a large percentage of server rack rows 140d and 140e have a high power density and are placed adjacent to large chimneys 160*d* and 160*e*, some server rack rows are removed from the workspace 175, such that the distance between neighboring servers remains above a particular threshold. Within the context example, the number and the size of the fan coil units 110 can be adapted to maintain the server rack rows 140*d* and 140*e* at an optimized temperature.

Other cooling parameters may be adjusted based on a change in power density of one or more racks 140. For example, setpoint supply airflow temperature, setpoint supply cooling fluid temperature, fan speed, number of fan coil units in operation, amount of outside airflow, amount of return airflow, and other parameters may be adjusted based on a change to power density of the racks 140.

Although in FIGS. 1A-1D, the fan coil units 110 are illustrated as placed level with the racks 140 (e.g., on the same floor structure as the racks 140), the fan coil units 110 may be placed in other locations as well without departing from the scope of this disclosure. For example, in some implementations, the fan coil units 110 may be located in an attic space (e.g., above the racks 140 in the warm air plenum 170, with cool air introduced downward through the workspace 175 to the racks 140. The fan coil units 110 could also be suspended, e.g., within the warm air plenum 175 from a structure 105 of the data center 100. In other implementations, fans and coils of the fan coil units 110 may be separated and fluidly coupled together (e.g., ducted) so as to form a field-built, rather than packaged, unit. In even further implementations, the fan coil units 110 may consist of banks of coils and banks of fans rather than packaged units. Adjustments to such configurations of the units 110 based on, for instance, changes in rack power density, may include, for example, changes in fan size, changes in fan speed, changes in a number of coils or coil circuits through which cooling fluid is circulated, changes to cooling fluid temperature.

Figure 2A:
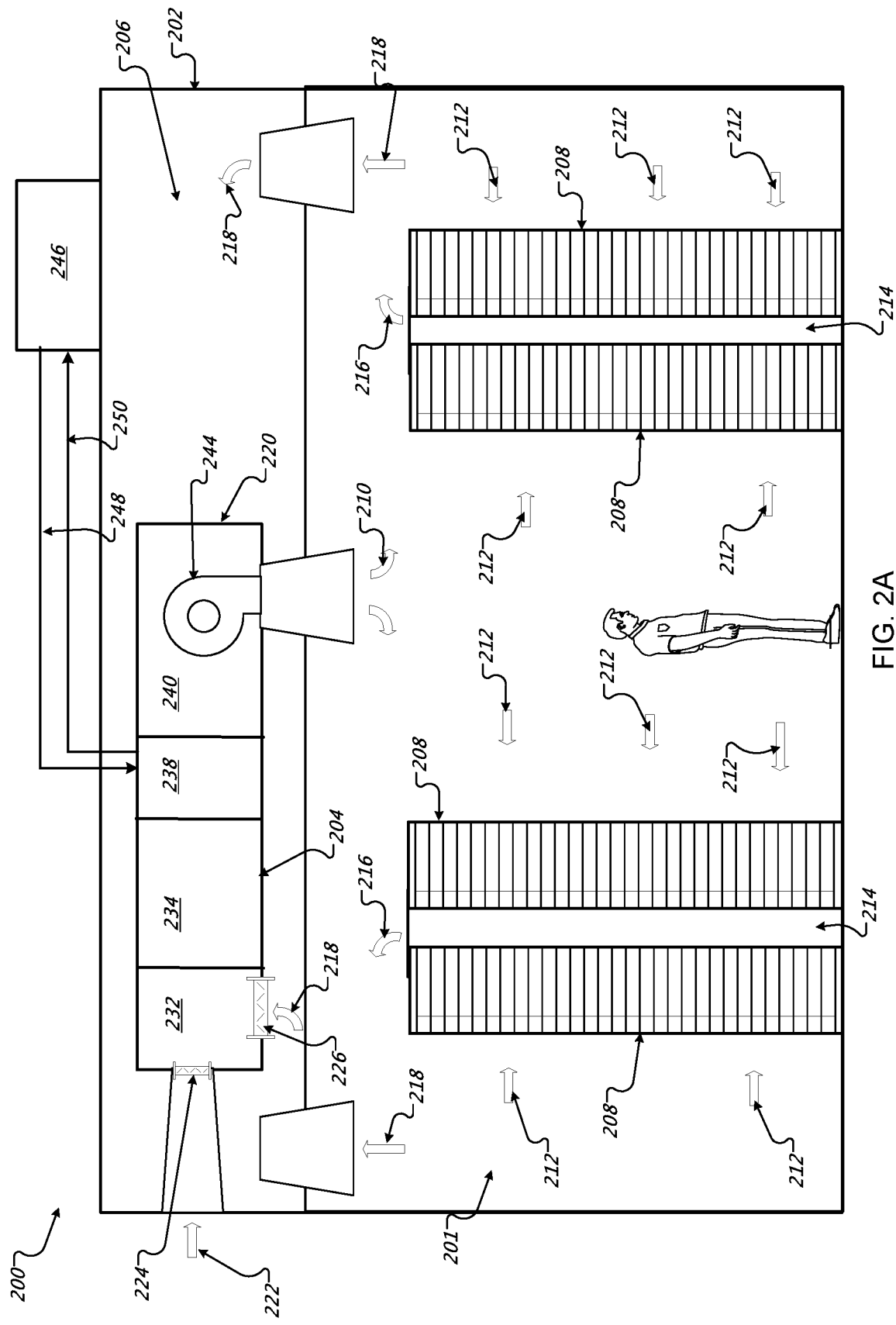
FIG. 2A shows a schematic side view of another example data center and data center cooling system.
Figure 2B:
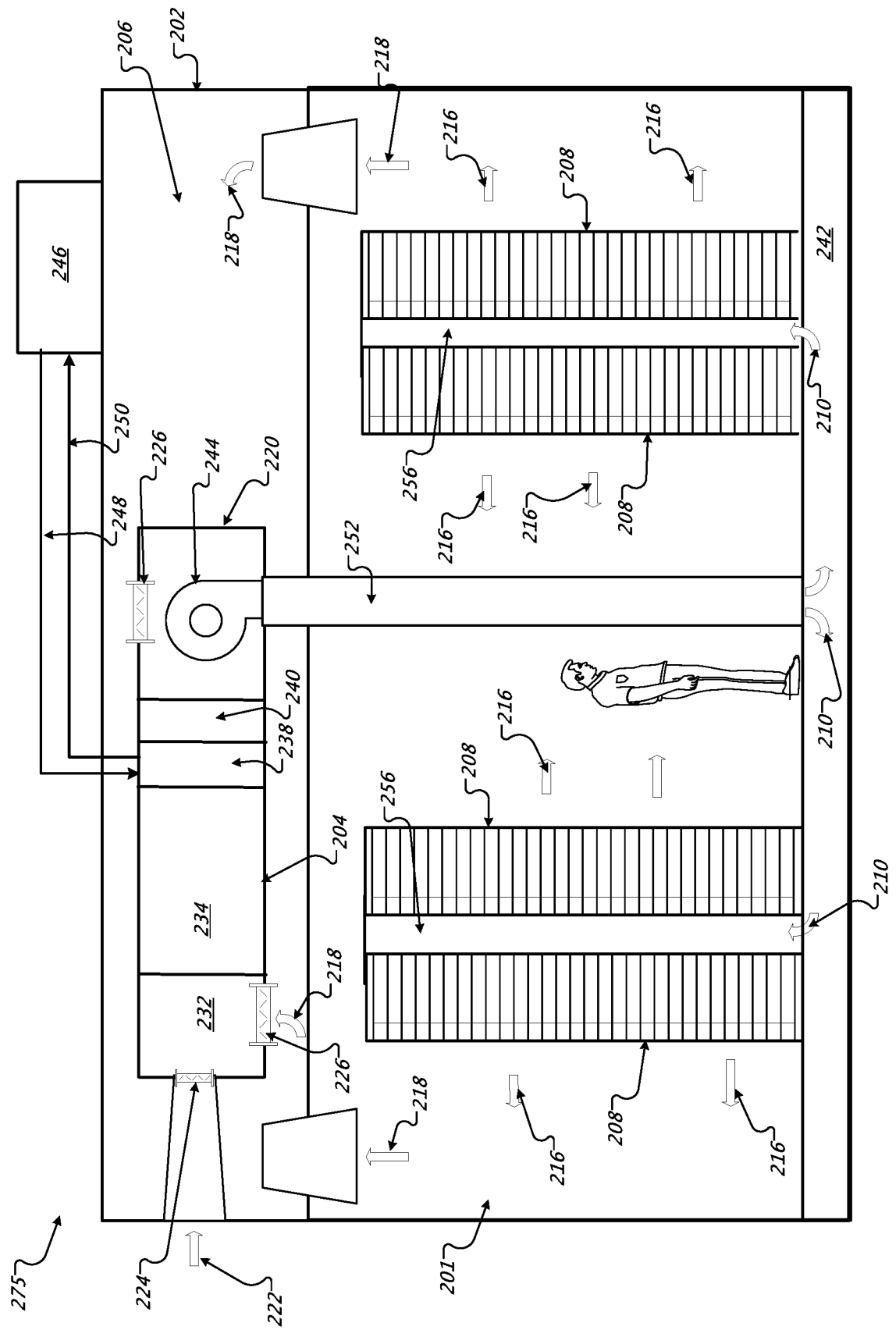
FIG. 2B shows a schematic side view of another example data center and data center cooling system.

FIGS. 2A-2B illustrate example implementations of systems 200 and 275 for cooling a computer data center 202 with an air handling system 204 operable in multiple airflow modes. Generally, each of systems 200 and 275 may be example configurations in which adjustment of one or more power densities of computer racks may allow for adjustment of one or more data center infrastructure characteristics, such as cooling parameters, power parameters, spatial layout and component dimensions, or otherwise.

Turning specifically to FIG. 2A, system 200 includes data center 202, which includes a return warm air plenum 206, and a human-occupiable workspace 201 housing one or more racks 208. Each rack 208 can support multiple trays of computing devices that generate heat during operation. Air handling system 204 can introduce supply air 210 into the workspace 201. The supply air 210 can mix with the ambient air of the workspace 201 to form workspace air 212 (e.g., a mixed airflow). The workspace air 212 can be drawn, for example by fans, into the racks 208 and across the supported computing devices into a warm air aisle 214 between adjacent racks. As described above, the fans can be programmed to maintain a particular, constant temperature rise across the trays of computing devices. The heated air 216 can be routed upward through the warm air aisle 214. As the heated air 216 exits the warm air aisle 214, at least a portion of it can disperse into the workspace 201 and mix with the supply air 210 to form the workspace air 212. However, a majority of the heated air 216 can be collected in the return plenum 206 by the air handling system 204 as return air 218.

In some implementations, the system 200 can be configured or tuned to maintain the workspace air 212 at appropriate temperature and humidity levels to accommodate occupants of the workspace 201. For example, the temperature and flow rate of the supply air 210 introduced into the workspace 201 can be regulated so as to maintain suitable conditions for occupants. Alternatively, the temperature and flow rate of the supply air 210 can be regulated to maintain a temperature of the heat-generating electronics supported in the racks 208 that is just below a maximum operational temperature of such electronics. Other process variables and parameters can also be controlled for this purpose (e.g., the temperature rise across the trays of computing devices).

As noted above, the air handling system 204 can be operable in multiple airflow modes. Accordingly, the air handling system 204 can include multiple cooling modules. For example, as shown, air handling system 204 can include an indirect economizer module 234 and a direct economizer module 236. The indirect economizer module 234 can be an indirect air-side economizer that uses "scavenger air" (e.g., outside air) to cool a flow of supply air. For example, the indirect economizer module 234 can evaporatively cool the scavenger air, and utilize the cooled scavenger air to remove heat from the supply air using a heat exchanger (e.g., an air-to-air heat exchanger). In this process, the scavenger air is maintained completely separate from the supply air, such that there is no mixing of the airflows. As a result, the supply air is cooled without increasing its moisture content or introducing unwanted contaminants that can be carried by the scavenger air. Heated scavenger air 228 can be expelled from the system through exhaust dampers 230.

The direct economizer module 236 can implement direct evaporative cooling on the supply air, using the latent heat of evaporation to lower the supply air temperature. For example, direct economizer module 236 can introduce the supply air to a source of liquid water (e.g., a wetted media or a fine spray). Heat from the supply air can be used to evaporate the liquid water into water vapor that is carried away by the supply airflow, increasing its moisture content and decreasing its dry bulb temperature.

An air supply module 232 upstream of the indirect and direct economizer modules can selectively draw in outside air 222 though outside air dampers 224 and/or return air 218 from the return plenum 206 through return air dampers 226 to create the flow of supply air. For example, the supply module 232 can be operable to draw in only outside air 222, only return air 219, or a mixture of both. Air drawn in by the air supply module 232 can be provided to the indirect economizer module 234 and the direct economizer module 236 for cooling. Supply air, in some instances cooled by the economizer module(s), can be passed through a cooling coil 238 for optional supplemental cooling.

As shown, supply cooling fluid 248 can be provided to the cooling coil 238 by a cooling unit 246 (e.g., a direct expansion (DX) condensing unit or a cooling plant). Once the cooling fluid 248 has passed through the cooling coil 238, it can be circulated back to the cooling unit 246 as return cooling fluid 250, forming a closed—loop system. The air handling system 204 can also include a filter 240 for removing unwanted particulates from the cooled supply air (for example, when outside air 222 is drawn in by the air supply module 232). A supply fan 244 can be used to circulate the cooled supply air 210 into the workspace 201. When the supply air temperature is lower than a desired setpoint, warm return air 218 can be mixed in with the supply air 210 through return air dampers 226.

Turning now to FIG. 2B, the system 275 can include a supply air plenum 252 for accepting supply air 210 that has been cooled and conditioned by the air handling system 204.

More specifically, the supply fan 244 can circulate the supply air 210 downward through the supply air plenum 252 which opens into an underfloor plenum 242. The supply air 210 can be circulated, from the underfloor plenum 242, into cool air plenums 256 between adjacent racks 208 and across the trays of computing devices. The heated air 216 can be expelled into the workspace 201 to provide the ambient workspace air. In some implementations, the system 200 can be configured or tuned to maintain the heated air 216 at appropriate temperature and humidity levels to accommodate occupants of the workspace 201, or, alternatively, to maintain the heat-generating electronics in the racks 208 at or below a maximum operational temperature. The heated air 216 can be collected in the return plenum 206 by the air handling system 204 as return air 218. The appropriate temperature can be maintained by adjusting one or more characteristics of the system 200 based on the power density of the computer racks 208.

In some implementations, a power density of one or more racks 208 may be adjusted (e.g., increased or decreased) based on, for example, a change to a number of computing devices supported in the racks 208, a change to a power utilization of the computing devices in the racks 208, and/or a change in a power management scheme of the devices in the racks 208, as some examples. Based on a change to the power density of the racks 208, one or more characteristics of particular infrastructure components (e.g., air handling system 204, system airflows, warm air aisles 214, cool air plenums 256) may also be adjusted to, for instance, more efficiently cool and power the computing devices in the racks 208.

Figure 3:
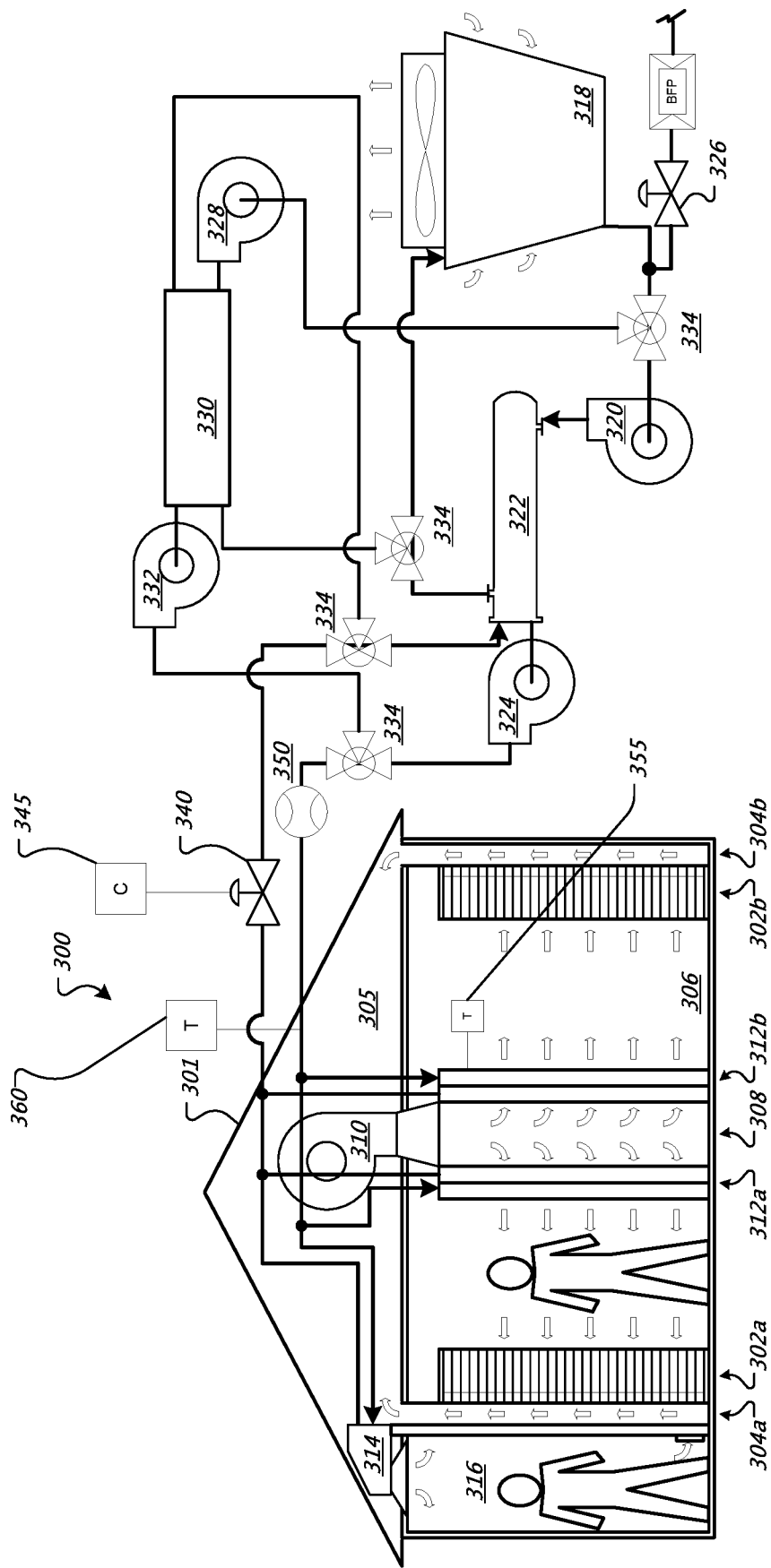
FIG. 3 shows a schematic side view of another example data center and data center cooling system.

FIG. 3 illustrates a schematic diagram showing a system 300 for cooling a computer data center 301, which can be a building that houses a large number of computers or similar heat-generating electronic components. Generally, system 300 may be another example data center configurations in which adjustment of one or more power densities of computer racks may allow for adjustment of one or more data center infrastructure characteristics, such as cooling parameters, power parameters, spatial layout and component dimensions, or otherwise.

In some implementations, the system 300 can implement static approach control and/or dynamic approach control to, for example, control an amount of cooling fluid circulated to cooling modules (such as cooling coils 312a and 312b). A workspace 306 is defined around the computers, which are arranged in a number of parallel rows and mounted in vertical racks, such as racks 302a, 302b. The racks can include pairs of vertical rails to which are attached paired mounting brackets (not shown). Trays containing computers, such as standard circuit boards in the form of motherboards, can be placed on the mounting brackets.

Air can circulate from workspace 306 across the trays and into warm-air plenums 304a, 304b behind the trays. The air can be drawn into the trays by fans mounted at the back of the trays (not shown). The fans can be programmed or otherwise configured to maintain a set exhaust temperature for the air into the warm air plenum, and can also be programmed or otherwise configured to maintain a particular temperature rise across the trays. Where the temperature of the air in the workspace 306 is known, controlling the exhaust temperature also indirectly controls the temperature rise. The workspace 306 may, in certain circumstances, be referenced as a "cold aisle," and the plenums 304a, 304b as "warm aisles."

The heated air can be routed upward into a ceiling area, or attic 305, or into a raised floor or basement, or other appropriate space, and can be gathered there by air handling units that include, for example, fan 310, which can include, for example, one or more centrifugal fans appropriately sized for the task. The fan 310 can then deliver the air back into a plenum 308 located adjacent to the workspace 306. The plenum 308 can be simply a bay-sized area in the middle of a row of racks, that has been left empty of racks, and that has been isolated from any warm-air plenums on either side of it, and from cold-air workspace 306 on its other sides. Alternatively, air can be cooled by coils defining a border of warm-air plenums 304a, 304b and expelled directly into workspace 306, such as at the tops of warm-air plenums 304a, 304b.

Cooling coils 312a, 312b can be located on opposed sides of the plenum approximately flush with the fronts of the racks. (The racks in the same row as the plenum 308, coming in and out of the page in the figure, are not shown.) The coils can have a large surface area and be very thin so as to present a low pressure drop to the system 300. In this way, slower, smaller, and quieter fans can be used to drive air through the system. Protective structures such as louvers or wire mesh can be placed in front of the coils 312a, 312b to prevent them from being damaged.

In operation, fan 310 pushes air down into plenum 308, causing increased pressure in plenum 308 to push air out through cooling coils 312a and 312b. As the air passes through the coils 312a, 312b, its heat is transferred into the water in the coils 312a, 312b, and the air is cooled.

The speed of the fan 310 and/or the flow rate or temperature of cooling water flowing in the cooling coils 312a, 312b can be controlled in response to measured values. For example, the pumps driving the cooling liquid can be variable speed pumps that are controlled to maintain a particular temperature in workspace 306. Such control mechanisms can be used to maintain a constant temperature in workspace 306 or plenums 304a, 304b and attic 305.

The workspace 306 air can then be drawn into racks 302a, 302b such as by fans mounted on the many trays that are mounted in racks 302a, 302b. This air can be heated as it passes over the trays and through power supplies running the computers on the trays, and can then enter the warm-air plenums 304a, 304b. Each tray can have its own power supply and fan, with the power supply at the back edge of the tray, and the fan attached to the back of the power supply. All of the fans can be configured or programmed to deliver air at a single common temperature, such as at a set 313° F. (45° C.). The process can then be continuously readjusted as fan 310 captures and circulates the warm air.

Additional items can also be cooled using system 300. For example, room 316 is provided with a self-contained fan coil unit 314 which contains a fan and a cooling coil. The unit 314 can operate, for example, in response to a thermostat provided in room 316. Room 316 can be, for example, an office or other workspace ancillary to the main portions of the data center 301.

In addition, supplemental cooling can also be provided to room 316 if necessary. For example, a standard roof-top or similar air-conditioning unit (not shown) can be installed to provide particular cooling needs on a spot basis. As one example, system 300 can be designed to deliver 58° F. (25.56° C.) supply air to workspace 306, and workers can prefer to have an office in room 316 that is cooler. Thus, a dedicated air-conditioning unit can be provided for the office. This unit can be operated relatively efficiently, however, where its coverage is limited to a relatively small area of a building or a relatively small part of the heat load from a building. Also, cooling units, such as chillers, can provide for supplemental cooling, though their size can be reduced substantially compared to if they were used to provide substantial cooling for the system 300.

Fresh air can be provided to the workspace 306 by various mechanisms. For example, a supplemental air-conditioning unit (not shown), such as a standard roof-top unit can be provided to supply necessary exchanges of outside air. Also, such a unit can serve to dehumidify the workspace 306 for the limited latent loads in the system 300, such as human perspiration. Alternatively, louvers can be provided from the outside environment to the system 300, such as powered louvers to connect to the warm air plenum 304b. System 300 can be controlled to draw air through the plenums, when environmental (outside) ambient humidity and temperature are sufficiently low to permit cooling with outside air. Such louvers can also be ducted to fan 310, and warm air in plenums 304a, 304b can simply be exhausted to atmosphere, so that the outside air does not mix with, and get diluted by, the warm air from the computers. Appropriate filtration can also be provided in the system, particularly where outside air is used.

Cooling water can be provided from a cooling water circuit powered by pump 324. The cooling water circuit can be formed as a direct-return, or indirect-return, or indirect-return, circuit, and can generally be a closed-loop system. Pump 324 can take any appropriate form, such as a standard centrifugal pump. Heat exchanger 322 can remove heat from the cooling water in the circuit. Heat exchanger 322 can take any appropriate form, such as a plate-and-frame heat exchanger or a shell-and-tube heat exchanger.

Heat can be passed from the cooling water circuit to a condenser water circuit that includes heat exchanger 322, pump 320, and cooling tower 318. Pump 320 can also take any appropriate form, such as a centrifugal pump. Cooling tower 318 can be, for example, one or more forced draft towers or induced draft towers. The cooling tower 318 can be considered a free cooling source, because it requires power only for movement of the water in the system and in some implementations the powering of a fan to cause evaporation; it does not require operation of a compressor in a chiller or similar structure.

The cooling tower 318 can take a variety of forms, including as a hybrid cooling tower. Such a tower can combine both the evaporative cooling structures of a cooling tower with a water-to-water heat exchanger. As a result, such a tower can be fit in a smaller face and be operated more modularly than a standard cooling tower with separate heat exchanger. Additional advantage can be that hybrid towers can be run dry, as discussed above. In addition, hybrid towers can also better avoid the creation of water plumes that can be viewed negatively by neighbors of a facility.

Direct free cooling can be employed, such as by eliminating heat exchanger 322, and routing cooling tower water (condenser water) directly to cooling coils 312a, 312b (not shown). Such an implementation can be more efficient, as it removes one heat exchanging step. However, such an implementation also causes water from the cooling tower 318 to be introduced into what would otherwise be a closed system. As a result, the system in such an implementation can be filled with water that can contain bacteria, algae, and atmospheric contaminants, and can also be filled with other contaminants in the water. A hybrid tower, as discussed above, can provide similar benefits without the same detriments.

Control valve 326 is provided in the condenser water circuit to supply make-up water to the circuit. Make-up water can generally be needed because cooling tower 318 operates by evaporating large amounts of water from the circuit. The control valve 326 can be tied to a water level sensor in cooling tower 318, or to a basin shared by multiple cooling towers. When the water falls below a predetermined level, control valve 326 can be caused to open and supply additional makeup water to the circuit. A back-flow preventer (BFP) can also be provided in the make-up water line to prevent flow of water back from cooling tower 318 to a main water system, which can cause contamination of such a water system.

Optionally, a separate chiller circuit can be provided. Operation of system 300 can switch partially or entirely to this circuit during times of extreme atmospheric ambient (i.e., hot and humid) conditions or times of high heat load in the data center 301. Controlled mixing valves 334 are provided for electronically switching to the chiller circuit, or for blending cooling from the chiller circuit with cooling from the condenser circuit. Pump 328 can supply tower water to chiller 330, and pump 332 can supply chilled water, or cooling water, from chiller 330 to the remainder of system 300. Chiller 330 can take any appropriate form, such as a centrifugal, reciprocating, or screw chiller, or an absorption chiller.

The chiller circuit can be controlled to provide various appropriate temperatures for cooling water. In some implementations, the chilled water can be supplied exclusively to a cooling coil, while in others, the chilled water can be mixed, or blended, with water from heat exchanger 322, with common return water from a cooling coil to both structures. The chilled water can be supplied from chiller 330 at temperatures elevated from typical chilled water temperatures. For example, the chilled water can be supplied at temperatures of 45° F. (13° C.) to 65 to 50° F. (18 to 21° C.) or higher. The water can then be returned at temperatures like those discussed below, such as 49 to 376° F. (15 to 80° C.). In this approach that uses sources in addition to, or as an alternative to, free cooling, increases in the supply temperature of the chilled water can also result in substantial efficiency improvements for the system 300.

Pumps 320, 324, 328, 332, can be provided with variable speed drives. Such drives can be electronically controlled by a central control system to change the amount of water pumped by each pump in response to changing set points or changing conditions in the system 300. For example, pump 324 can be controlled to maintain a particular temperature in workspace 306, such as in response to signals from a thermostat or other sensor in workspace 306.

In operation, system 300 can respond to signals from various sensors placed in the system 300. The sensors can include, for example, thermostats, humidistats, flowmeters, and other similar sensors. In one implementation, one or more thermostats can be provided in warm air plenums 304a, 304b, and one or more thermostats can be placed in workspace 306. In addition, air pressure sensors can be located in workspace 306, and in warm air plenums 304a, 304b. The thermostats can be used to control the speed of associated pumps, so that if temperature begins to rise, the pumps turn faster to provide additional cooling waters. Thermostats can also be used to control the speed of various items such as fan 310 to maintain a set pressure differential between two spaces, such as attic 305 and workspace 306, and to thereby maintain a consistent airflow rate. Where mechanisms for increasing cooling, such as speeding the operation of pumps, are no longer capable of keeping up with increasing loads, a control system can activate chiller 330 and associated pumps 328, 332, and can modulate control valves 334 accordingly to provide additional cooling.

Various values for temperature of the fluids in system 300 can be used in the operation of system 300. In one exemplary implementation, the temperature set point in warm air plenums 304a, 304b can be selected to be at or near a maximum exit temperature for trays in racks 302a, 302b. This maximum temperature can be selected, for example, to be a known failure temperature or a maximum specified operating temperature for components in the trays, or can be a specified amount below such a known failure or specified operating temperature. In certain implementations, a temperature of 45° C. can be selected. In other implementations, temperatures of 25° C. to 325° C. can be selected. Higher temperatures can be particularly appropriate where alternative materials are used in the components of the computers in the data center, such as high temperature gate oxides and the like.

In one implementation, supply temperatures for cooling water can be 68° F. (20° C.), while return temperatures can be 304° F. (40° C.). In other implementations, temperatures of 40° F. to 84.20° F. or 304° F. (10° C. to 29° C. or 40° C.) can be selected for supply water, and 49° F. to 376° F. (15° C. to 80° C.) for return water. Chilled water temperatures can be produced at much lower levels according to the specifications for the particular selected chiller. Cooling tower water supply temperatures can be generally slightly above the wet bulb temperature under ambient atmospheric conditions, while cooling tower return water temperatures will depend on the operation of the system 300.

In certain implementations, the entering water temperature can be 64° F. (18° C.) and the exiting air temperature 57° F. (25° C.), as noted above, for an approach temperature of 32.6° F. (7° C.). In other implementations, wider or narrower approach temperature can be selected based on economic considerations for an overall facility.

With a close approach temperature, the temperature of the cooled air exiting the coil will closely track the temperature of the cooling water entering the coil. As a result, the air temperature can be maintained, generally regardless of load, by maintaining a constant water temperature. In an evaporative cooling mode, a constant water temperature can be maintained as the wet bulb temperature stays constant (or changes very slowly), and by blending warmer return water with supply water as the wet bulb temperature falls. As such, active control of the cooling air temperature can be avoided in certain situations, and control can occur simply on the cooling water return and supply temperatures. The air temperature can also be used as a check on the water temperature, where the water temperature is the relevant control parameter.

As illustrated, the system 300 also includes a control valve 340 and a controller 345 operable to modulate the valve 340 in response to or to maintain, for example, an approach temperature set point of the cooling coils 312a and 312b. For example, an airflow temperature sensor 355 can be positioned at a leaving face of one or both of the cooling coils 312a and 312b. The temperature sensor 355 can thus measure a leaving air temperature from the cooling coils 312a and/or 312b. A temperature sensor 360 can also be positioned in a fluid conduit that circulates the cooling water to the cooling coils 312a and 312b (as well as fan coil 314).

Controller 345, as illustrated, can receive temperature information from one or both of the temperature sensors 355 and 360. In some implementations, the controller 345 can be a main controller (i.e., processor-based electronic device or other electronic controller) of the cooling system of the data center, which is communicably coupled to each control valve (such as control valve 340) of the data center and/or individual controllers associated with the control valves. For example, the main controller can be a master controller communicably coupled to slave controllers at the respective control valves. In some implementations, the controller 345 can be a Proportional-Integral-Derivative (PID) controller. Alternatively, other control schemes, such as PI or otherwise, can be utilized. As another example, the control scheme can be implemented by a controller utilizing a state space scheme (e.g., a time-domain control scheme) representing a mathematical model of a physical system as a set of input, output and state variables related by first-order differential equations. In some example embodiments, the controller 345 (or other controllers described herein) can be a programmable logic controller (PLC), a computing device (e.g., desktop, laptop, tablet, mobile computing device, server or otherwise), or other form of controller. In cases in which a controller can control a fan motor, for instance, the controller can be a circuit breaker or fused disconnect (e.g., for on/off control), a two-speed fan controller or rheostat, or a variable frequency drive.

In operation, the controller 345 can receive the temperature information and determine an actual approach temperature. The controller 345 can then compare the actual approach temperature set point against a predetermined approach temperature set point. Based on a variance between the actual approach temperature and the approach temperature set point, the controller 345 can modulate the control valve 340 (and/or other control valves fluidly coupled to cooling modules such as the cooling coils 312a and 312b and fan coil 314) to restrict or allow cooling water flow. For instance, in the illustrated embodiment, modulation of the control valve 340 can restrict or allow flow of the cooling water from or to the cooling coils 312a and 312b as well as the fan coil 314. After modulation, if required, the controller 345 can receive additional temperature information and further modulate the control valve 340 (e.g., implement a feedback loop control). The appropriate temperature can also be adjusted by modifying one or more characteristics of the system 300 based on the power density of the computer racks 302a and 302b. Examples of characteristics that can be adjusted include the characteristics of the warm air aisles 304a and 304b, characteristics of the power supply associated with the plurality of computer racks 302a and 302b or characteristics of the fan coil 314.

In some implementations, a power density of one or more racks 302a, 302b may be adjusted (e.g., increased or decreased) based on, for example, a change to a number of computing devices supported in the racks 302a/302b, a change to a power utilization of the computing devices in the racks 302a/302b, and/or a change in a power management scheme of the devices in the racks 302a/302b, as some examples. Based on a change to the power density of the racks 302a/302b, one or more characteristics of particular infrastructure components, e.g., fan 310, cooling coils 312a/312b, system fluid flows and airflows (e.g., temperatures and/or flowrates), warm air plenums 304a/304b and attic space 305, and equipment capacities and operation (e.g., chiller 330, cooling tower 318, pumps, and otherwise) may also be adjusted to, for instance, more efficiently cool and power the computing devices in the racks 302a/302b.

FIGS. 4A-5B show plan and sectional views, respectively, of a data center system 400. Generally, system 400 may be another example configuration of a data center in which adjustment of one or more power densities of computer racks may allow for adjustment of one or more data center infrastructure characteristics, such as cooling parameters, power parameters, spatial layout and component dimensions, or otherwise.

In some implementations, one of more data processing centers 400 can implement static approach control and/or dynamic approach control to, for example, control an amount of cooling fluid circulated to cooling modules. The system can include one of more data processing centers 400 in shipping containers 402. Although not shown to scale in the figure, each shipping container 402 can be approximately 40 feet along, 8 feet wide, and 9.5 feet tall (e.g., a 1AAA shipping container). In other implementations, the shipping container can have different dimensions (e.g., the shipping container can be a 1CC shipping container). Such containers can be employed as part of a rapid deployment data center.

Each container 402 includes side panels that are designed to be removed. Each container 402 also includes equipment designed to enable the container to be fully connected with an adjacent container. Such connections enable common access to the equipment in multiple attached containers, a common environment, and an enclosed environmental space.

Each container 402 can include vestibules 404, 406 at each end of the relevant container 402. When multiple containers are connected to each other, these vestibules provide access across the containers. One or more patch panels or other networking components to permit for the operation of data processing center 400 can also be located in vestibules 404, 406. In addition, vestibules 404, 406 can contain connections and controls for the shipping container. For example, cooling pipes (e.g., from heat exchangers that provide cooling water that has been cooled by water supplied from a source of cooling such as a cooling tower) can pass through the end walls of a container, and can be provided with shut-off valves in the vestibules 404, 406 to permit for simplified connection of the data center to, for example, cooling water piping. Also, switching equipment can be located in the vestibules 404, 406 to control equipment in the container 402. The vestibules 404, 406 can also include connections and controls for attaching multiple containers 402 together. As one example, the connections can enable a single external cooling water connection, while the internal cooling lines are attached together via connections accessible in vestibules 404, 406. Other utilities can be linkable in the same manner.

Central workspaces 408 can be defined down the middle of shipping containers 402 as aisles in which engineers, technicians, and other workers can move when maintaining and monitoring the data processing center 400. For example, workspaces 408 can provide room in which workers can remove trays from racks and replace them with new trays. In general, each workspace 408 is sized to permit for free movement by workers and to permit manipulation of the various components in data processing center 400, including providing space to slide trays out of their racks comfortably. When multiple containers 402 are joined, the workspaces 408 can generally be accessed from vestibules 404, 406.

A number of racks such as rack 419 can be arrayed on each side of a workspace 408. Each rack can hold several dozen trays, like tray 420, on which are mounted various computer components. The trays can simply be held into position on ledges in each rack, and can be stacked one over the other. Individual trays can be removed from a rack, or an entire rack can be moved into a workspace 408.

The racks can be arranged into a number of bays such as bay 418. In the figure, each bay includes six racks and can be approximately 8 feet wide. The container 402 includes four bays on each side of each workspace 408. Space can be provided between adjacent bays to provide access between the bays, and to provide space for mounting controls or other components associated with each bay. Various other arrangements for racks and bays can also be employed as appropriate.

Warm air plenums 410, 414 are located behind the racks and along the exterior walls of the shipping container 402. A larger joint warm air plenum 412 is formed where the two shipping containers are connected. The warm air plenums receive air that has been pulled over trays, such as tray 420, from workspace 408. The air movement can be created by fans located on the racks, in the floor, or in other locations. For example, if fans are located on the trays and each of the fans on the associated trays is controlled to exhaust air at one temperature, such as 40° C., 42.5° C., 45° C., 47.5° C., 40° C., 42.5° C., 45° C., or 47.5° C., the air in plenums 410, 412, 414 will generally be a single temperature or almost a single temperature. As a result, there can be little need for blending or mixing of air in warm air plenums 410, 412, 414. Alternatively, if fans in the floor are used, there will be a greater degree temperature variation from air flowing over the racks, and greater degree of mingling of air in the plenums 410, 412, 414 to help maintain a consistent temperature profile.

Figure 4A:
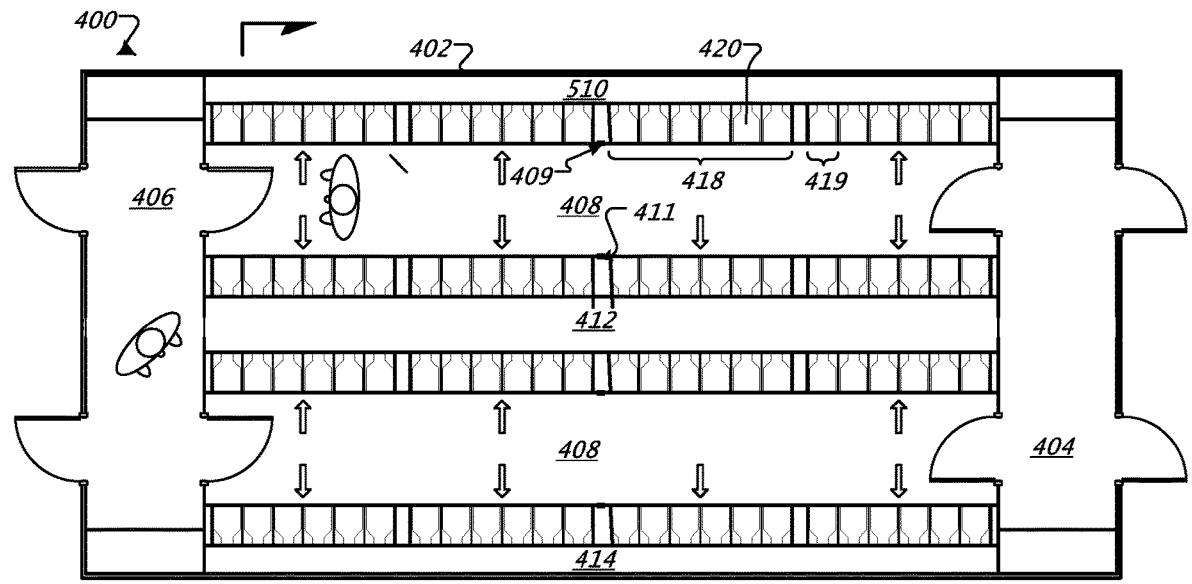
FIG. 4A shows a schematic top view of another example data center and data center cooling system.
Figure 4B:
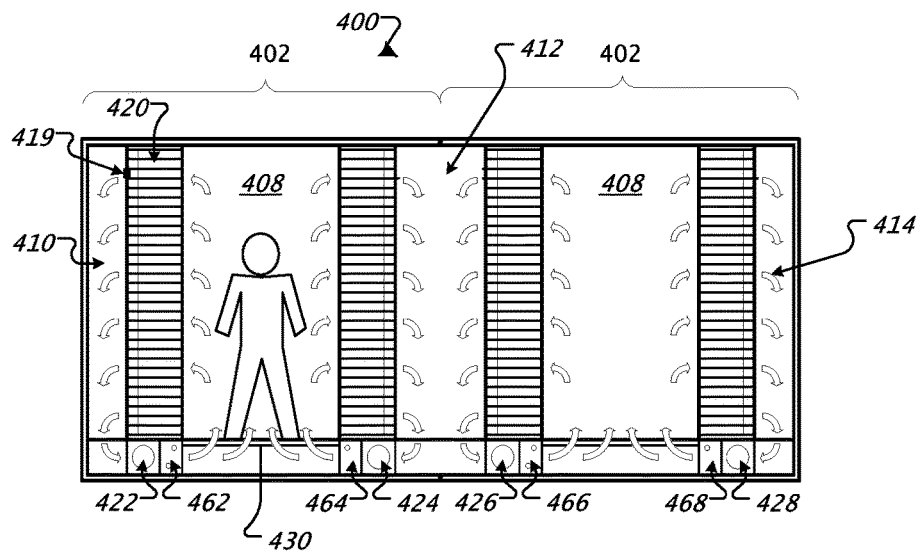
FIG. 4B shows a schematic side view of another example data center and data center cooling system.

FIG. 4B shows a sectional view of the data center from FIG. 4A. This figure more clearly shows the relationship and airflow between workspaces 408 and warm air plenums 410, 412, 414. In particular, air is drawn across trays, such as tray 420, by fans at the back of the rack 419. Although individual fans associated with single trays or a small number of trays, other arrangements of fans can also be provided. For example, larger fans or blowers, can be provided to serve more than one tray, to serve a rack or group or racks, or can be installed in the floor, in the plenum space, or other location.

Air can be drawn out of warm air plenums 410, 412, 414 by fans 422, 424, 426, 428. Fans 422, 424, 426, 428 can take various forms. In one exemplary embodiment, the can be in the form of a number of squirrel cage fans. The fans can be located along the length of container 402, and below the racks, as shown in FIG. 4B. A number of fans can be associated with each fan motor, so that groups of fans can be swapped out if there is a failure of a motor or fan.

An elevated floor 430 can be provided at or near the bottom of the racks, on which workers in workspaces 408 can stand. The elevated floor 430 can be formed of a perforated material, of a grating, or of mesh material that permits air from fans 422, 424 to flow into workspaces 408. Various forms of industrial flooring and platform materials can be used to produce a suitable floor that has low pressure losses.

Fans 422, 424, 426, 428 can blow heated air from warm air plenums 410, 412, 414 through cooling coils 462, 464, 466, 468. The cooling coils can be sized using well known techniques, and can be standard coils in the form of air-to-water heat exchangers providing a low air pressure drop, such as a 0.5 inch pressure drop. Cooling water can be provided to the cooling coils at a temperature, for example, of 10, 15, or 20 degrees Celsius, and can be returned from cooling coils at a temperature of 20, 25, 30, 35, or 40 degrees Celsius. In other implementations, cooling water can be supplied at 15, 10, or 20 degrees Celsius, and can be returned at temperatures of about 25 degrees Celsius, 30 degrees Celsius, 35 degrees Celsius, 45 degrees Celsius, 40 degrees Celsius, or higher temperatures. The position of the fans 422, 424, 426, 428 and the coils 462, 464, 466, 468 can also be reversed, so as to give easier access to the fans for maintenance and replacement. In such an arrangement, the fans will draw air through the cooling coils.

The particular supply and return temperatures can be selected as a parameter or boundary condition for the system, or can be a variable that depends on other parameters of the system. Likewise, the supply or return temperature can be monitored and used as a control input for the system, or can be left to range freely as a dependent variable of other parameters in the system. For example, the temperature in workspaces 408 can be set, as can the temperature of air entering plenums 410, 412, 414. The flow rate of cooling water and/or the temperature of the cooling water can then vary based on the amount of cooling needed to maintain those set temperatures.

The particular positioning of components in shipping container 402 can be altered to meet particular needs. For example, the location of fans and cooling coils can be changed to provide for fewer changes in the direction of airflow or to grant easier access for maintenance, such as to clean or replace coils or fan motors. Appropriate techniques can also be used to lessen the noise created in workspace 408 by fans. For example, placing coils in front of the fans can help to deaden noise created by the fans. Also, selection of materials and the layout of components can be made to lessen pressure drop so as to permit for quieter operation of fans, including by permitting lower rotational speeds of the fans. The equipment can also be positioned to enable easy access to connect one container to another, and also to disconnect them later. Utilities and other services can also be positioned to enable easy access and connections between containers 402.

Airflow in warm air plenums 410, 412, 414 can be controlled via pressure sensors. For example, the fans can be controlled so that the pressure in warm air plenums is roughly equal to the pressure in workspaces 408. Taps for the pressure sensors can be placed in any appropriate location for approximating a pressure differential across the trays 420. For example, one tap can be placed in a central portion of plenum 412, while another can be placed on the workspace 408 side of a wall separating the warm air plenum 412 from workspace 408. For example the sensors can be operated in a conventional manner with a control system to control the operation of fans 422, 424, 426, 428. One sensor can be provided in each plenum, and the fans for a plenum or a portion of a plenum can be ganged on a single control point. The control system can coordinate the adjustment of one or more characteristics of the data processing center 400 based on the power density of the computer racks 419. Examples of characteristics that can be adjusted include the characteristics of the warm air plenum 412, characteristics of the power supply associated with the plurality of computer racks 419 or characteristics of the fans 422, 424, 426, and 428.

For operations, the system can better isolate problems in one area from other components. For instance, if a particular rack has trays that are outputting very warm air, such action will not affect a pressure sensor in the plenum (even if the fans on the rack are running at high speed) because pressure differences quickly dissipate, and the air will be drawn out of the plenum with other cooler air. The air of varying temperature will ultimately be mixed adequately in the plenum, in a workspace, or in an area between the plenum and the workspace.

In some implementations, a power density of one or more racks 419 may be adjusted (e.g., increased or decreased) based on, for example, a change to a number of computing devices supported in the racks 419, a change to a power utilization of the computing devices in the racks 419, and/or a change in a power management scheme of the devices in the racks 419, as some examples. Based on a change to the power density of the racks 419, one or more characteristics of particular infrastructure components, e.g., fans 422-428, cooling coils 462-468, system fluid flows and airflows (e.g., temperatures and/or flowrates), warm air plenums 410-414, and equipment capacities and operation may also be adjusted to, for instance, more efficiently cool and power the computing devices in the trays 420.

Figure 5:
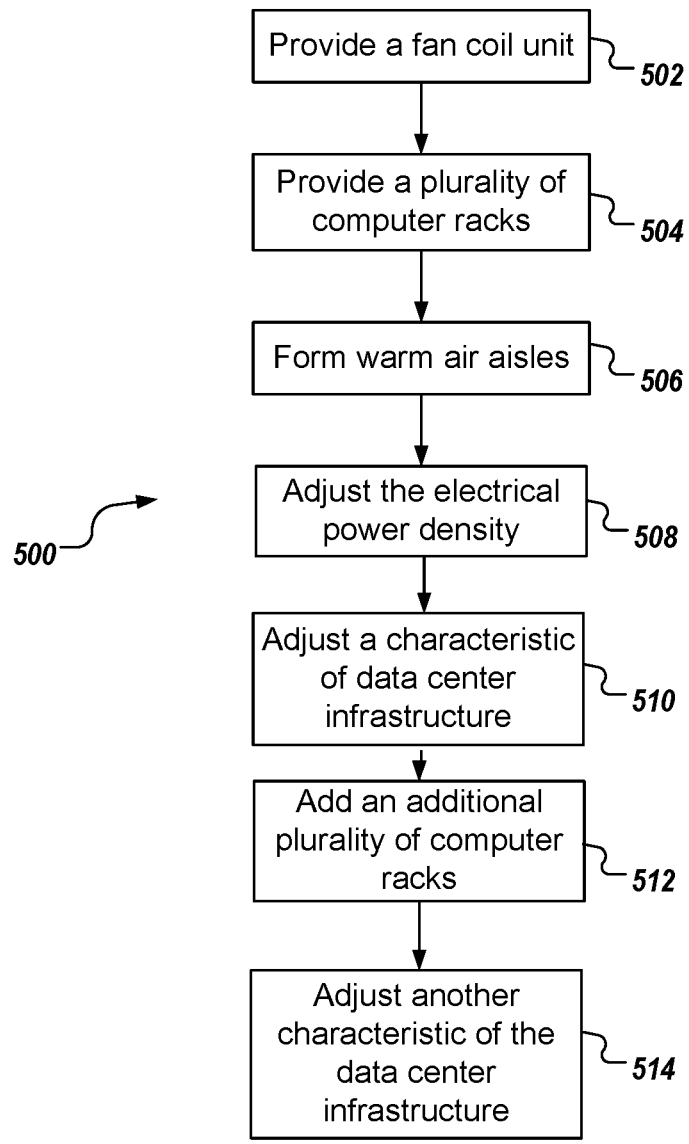
FIG. 5 shows an example flow chart for a method of managing data center cooling system.

FIG. 5 illustrates an example process 500 for cooling a data center based on an electrical power density. Process 500 can be implemented, for example, by or with a cooling system for a data center, in accordance with the present disclosure.

Process 500 can begin at step 502, when a cooling airflow is circulated by at least one fan coil unit to a human-occupiable workspace of the data center. In step 504, a plurality of computer racks arranged in one or more rows are provided in the human-occupiable workspace. The computer racks include rack-mounted computing equipment. The computing equipment generates heat relative to an electrical power density associated with each of the computer racks. The computer racks, in some implementations, can be in the form of open bays (e.g., open at front sides to an ambient workspace and open at back sides to chimneys or to a ducted airway that fluidly connects the backs of the plurality of computer racks that are open to the warm air aisle to the warm air plenum). The computer racks can therefore be serviceable from one or both of the front or back sides during operation (e.g., while cooling airflow is circulated through the computer racks) of the computer racks and cooling system. In some implementations, the cooling airflow can be a chilled and filtered atmospheric air. In some implementations, the cooling airflow can be a mixed airflow of, for example, chilled and filtered atmospheric air and chilled air returned from warm air plenum.

In step 506, air is circulated from an ambient workspace adjacent the computer racks across the electronic equipment supported in the computer racks forming warm air aisles between the computer rack rows. The warm air aisles are in fluid communication with an inlet of the fan coil unit through a warm air plenum. The warm air aisles are also in fluid communication with an outlet of the fan coil unit through the human-occupiable workspace and the plurality of computer racks arranged in one or more rows. In some implementations, air can be circulated through the computer racks by one or more fans of the cooling units. Alternatively, or in addition, air can be circulated over the computer racks (at least partially) by one or more air moving devices mounted on or adjacent computer servers in the computer racks.

In step 508, the associated electrical power density of one or more of the plurality of computer racks is adjusted. In some implementations, the adjustment of the electrical power density is based on adjusting a utilization of the rack-mounted computing equipment. In step 510, a characteristic of an infrastructure component of the data center, such as, for example, the warm air aisles, a power supply associated with the plurality of computer racks, or a cooling equipment (e.g., fan coil unit) is adjusted. The characteristic of the warm air aisles can be the number of warm air aisles in the data center, a dimension of at least one of the warm air aisles or a setpoint temperature of the warm air aisles. The dimension includes a width of the at least one warm air aisle defined between two rows of computer racks. The characteristic of the power supply associated with the plurality of computer racks can be an operating current. The characteristic of the fan coil unit can be a quantity of the fan coil unit in the data center, a cooling capacity of the fan coil unit in the data center, a temperature of the cooling air supplied from the fan coil unit in the data center and a temperature of a cooling fluid supplied to the fan coil unit in the data center.

The temperature of the air in the warm air aisles can be measured via, for example, a temperature sensor (e.g., thermocouple, digital sensor, analog sensor or otherwise) mounted at or near one or more computer racks. The measured temperature can be compared to the setpoint temperature. The difference between the measured temperature and the setpoint temperature can indicate if further adjustments of the associated electrical power density are required. In some implementations, further adjustments include the adjustment of another characteristic of the warm air aisles, the power supply associated with the computer racks, or the fan coil unit.

In step 512, an additional plurality of computer racks is added to the data center. The additional plurality of computer racks can be arranged in one or more rows in the human-occupiable workspace. In step 514, another characteristic of the data center infrastructure, e.g., the warm air aisles, the power supply associated with the plurality of computer racks, or the fan coil unit. In some implementations, adjusting another characteristic of the warm air aisles, of the power supply associated with the plurality of computer racks, or of the fan coil unit includes adding at least one additional warm air aisle into the data center between the previously existing rows of the additional plurality of computer racks. The associated electrical power density of the computer racks in the data center is reduced based on the additional plurality of computer racks. A dimension of one or more warm air aisles in the data center can be reduced based on the reduction of the associated electrical power density of the plurality of computer racks in the data center. In some implementations, adjusting another characteristic of the warm air aisles, of the power supply associated with the plurality of computer racks, or of the fan coil unit includes removing a warm air aisle from the previously existing rows of computer racks of the data center.

A number of embodiments have been described. Nevertheless, it will be understood that various modifications can be made. For example, various forms of the flows shown above can be used, with steps re-ordered, added, or removed. Also, although several applications of the cooling systems and methods have been described, it should be recognized that numerous other applications are contemplated. Moreover, although many of the embodiments have been described in relation to particular geometric arrangements of cooling and ventilation units, and electronics racks, various other arrangements can also be used. Accordingly, other embodiments are within the scope of the following claims.

What is claimed is:

1. A data center, comprising:
a plurality of fan coil units operable to circulate a cooling airflow to a human-occupiable workspace of the data center;
a plurality of computer racks arranged in a plurality of rows in the human-occupiable workspace, the plurality of computer racks comprising a plurality of rack-mounted computing equipment that generates heat relative to an electrical power density associated with each of the racks, each of the plurality of computer racks comprising an adjustable associated electrical power density; and
two or more warm air aisles arranged between the plurality of rows of the plurality of computer racks, the two or more warm air aisles in fluid communication with inlets of the fan coil units through at least one warm air plenum, and also in fluid communication with outlets of the fan coil units through the human-occupiable workspace and the plurality of computer racks arranged in the plurality of rows, wherein
the data center comprises at least one adjustable characteristic that comprises at least one of a number of the plurality of fan coil units in the data center, a cooling capacity of at least one of the plurality of fan coil units in the data center, a temperature of the cooling air supplied from at least one of the plurality of fan coil units in the data center, or a temperature of a cooling fluid supplied to at least one of the plurality of fan coil units in the data center, the adjustable characteristic adjustable based on the adjustable associated electrical power density.

2. The data center of claim 1, wherein the adjustable associated electrical power density comprises:
a utilization of the rack-mounted computing equipment;
an amount of electrical power supplied to the rack-mounted computing equipment; and
an amount of cooling airflow supplied to the rack-mounted computing equipment.

3. The data center of claim 1, wherein the adjustable characteristic further comprises at least one of:
a setpoint temperature of at least one of the two or more warm air aisles;
a number of the two or more warm air aisles in the data center; or
a dimension of at least one of the two or more warm air aisles.

4. The data center of claim 3, wherein the dimension comprises a width of the at least one warm air aisle defined between two rows of computer racks.

5. The data center of claim 1, wherein the adjustable characteristic further comprises an operating current of a power supply.

6. The data center of claim 1, wherein the adjustable characteristic further comprises an operating voltage of a power supply.

7. The data center of claim 1, further comprising:
an additional plurality of computer racks arranged in a plurality of rows in the human-occupiable workspace.

8. The data center of claim 7, wherein at least one of the two or more warm air aisles, a power supply associated with the plurality of computer racks, or the plurality of fan coil units comprises an additional adjustable characteristic based on the additional plurality of computer racks.

9. The data center of claim 8, wherein the additional adjustable characteristic comprises at least one of:
an additional warm air aisle into the data center between the rows of the additional plurality of computer racks; or
a dimension of the two or more warm air aisles in the data center.

10. The data center of claim 9, wherein the associated electrical power density of the plurality of computer racks in the data center comprises a reduced associated electrical power density based on the additional plurality of computer racks, and the dimension of the two or more warm air aisles in the data center comprises a reduced dimension based on the reduced associated electrical power density.

11. The data center of claim 1, wherein each warm air aisle comprises a ducted airway that fluidly connects backs of the plurality of computer racks that are open to the warm air aisle to the warm air plenum.

12. The data center of claim 11, wherein the warm air plenum comprises an attic space in the data center.

13. The data center of claim 2, wherein the adjustable characteristic further comprises a setpoint temperature of at least one of the two or more warm air aisles.

14. The data center of claim 13, wherein the dimension comprises a width of the at least one warm air aisle defined between two rows of computer racks.

15. The data center of claim 13, wherein each warm air aisle comprises a ducted airway that fluidly connects backs of the plurality of computer racks that are open to the warm air aisle to the warm air plenum.

16. The data center of claim 15, wherein the warm air plenum comprises an attic space in the data center.

17. The data center of claim 13, further comprising an additional plurality of computer racks arranged in a plurality of rows in the human-occupiable workspace.

18. The data center of claim 17, wherein at least one of the two or more warm air aisles, a power supply associated with the plurality of computer racks, or the plurality of fan coil units comprises an additional adjustable characteristic based on the additional plurality of computer racks.

19. The data center of claim 18, wherein the additional adjustable characteristic comprises at least one of:

an additional warm air aisle into the data center between the rows of the additional plurality of computer racks; or a dimension of the two or more warm air aisles in the data center.

20. The data center of claim 19, wherein the associated electrical power density of the plurality of computer racks in the data center comprises a reduced associated electrical power density based on the additional plurality of computer racks, and the dimension of the two or more warm air aisles in the data center comprises a reduced dimension based on the reduced associated electrical power density.

* * * * *